(12) United States Patent
Gamliel

(10) Patent No.: US 7,013,122 B2
(45) Date of Patent: Mar. 14, 2006

(54) ULTRA HIGH ISOLATION MIXER

(75) Inventor: Doron Gamliel, Kiriat-Ata (IL)

(73) Assignee: Scientific Components Corporation, Brooklyn, NY (US)

( * ) Notice: Subject to any disclaimer, the term of this patent is extended or adjusted under 35 U.S.C. 154(b) by 640 days.

(21) Appl. No.: 09/928,049

(22) Filed: Aug. 13, 2001

(65) Prior Publication Data

US 2002/0049043 A1    Apr. 25, 2002

Related U.S. Application Data

(60) Provisional application No. 60/242,893, filed on Oct. 23, 2000.

(51) Int. Cl.
*H04B 1/26* (2006.01)
(52) U.S. Cl. .................. 455/330; 455/209; 455/323; 455/325; 455/326; 455/333
(58) Field of Classification Search ............... 455/330, 455/326, 318, 333; 332/43
See application file for complete search history.

(56) References Cited

U.S. PATENT DOCUMENTS

| | | | | |
|---|---|---|---|---|
| 3,913,037 A | * | 10/1975 | Himono et al. | ............. 332/175 |
| 4,224,572 A | * | 9/1980 | Will | ........................... 455/326 |
| 5,774,801 A | * | 6/1998 | Li et al. | ...................... 455/326 |
| 5,854,974 A | * | 12/1998 | Li | ............................... 455/330 |
| 6,278,872 B1 | * | 8/2001 | Poulin et al. | ............... 455/333 |
| 2002/0032016 A1 | * | 3/2002 | Ji | ............................... 455/326 |

* cited by examiner

*Primary Examiner*—Fan Tsang
*Assistant Examiner*—Lisa Hashem
(74) *Attorney, Agent, or Firm*—Kevin Redmond

(57) ABSTRACT

A double balanced mixer for mixing an RF input signal with a local oscillator signal to provide at an output an intermediate frequency signal with high isolation over a wide frequency range. The mixer includes a local oscillator balun that is operable to receive a local oscillator signal. A RF balun that is operable to receive a RF signal. A first mixer has a first input port that is coupled to the local oscillator balun and a second input port that is coupled to the RF balun. The first mixer has an output port to provide an intermediate frequency signal. A second mixer is coupled in parallel with the first mixer. The second mixer has a first input port that is coupled to the local oscillator balun and a second input port that is coupled to the RF balun. The second mixer has an output port that provides an intermediate frequency signal. An intermediate frequency balun is coupled to the output ports of the first and second mixers.

11 Claims, 3 Drawing Sheets

ULTRA HIGH ISOLATION MIXER

This appln. claims the benefit of U.S. patent application Ser. No. 60/242,893 filed on Oct. 23, 2000.

BACKGROUND OF THE INVENTION

1. Field of the Invention

This invention relates to mixers in general and more particularly to a double balanced mixer that provides increased isolation.

2. Description of the Prior Art

A mixer circuit converts a radio frequency (RF) signal to an intermediate frequency (IF) signal which is the difference of the RF and a local oscillator (LO) signal. The IF frequency is obtained by multiplying the RF signal with the local oscillator (LO) signal. The difference or IF frequency is a result of the non-linearity of the mixer. Along with the IF frequency, the mixer typically generates intermodulation products due to the non-linearity response.

Isolation is a measure of the circuit balance within the mixer. When the isolation is high, the amount of leakage or feed through between the mixer ports will be very small. Typically, isolation decreases as frequency increases due to the unbalance in the mixer circuit. Isolation can be measured as LO-RF isolation which is the amount the LO drive level is attenuated when it is measured at the RF port. LO to IF isolation is the amount the LO drive level is attenuated when it is measured at the IF port.

Mixers are typically designed with one of three topologies: single ended, balanced, and double balanced. The double balanced mixers are capable of isolating both the RF signal and the local oscillator LO voltages from the output and thus allow overlap of the RF and IF frequency bandwidths. Several prior art mixer circuits are well known. One mixer design uses a schottky diode quad or ring circuit that uses four diodes with all of the diodes pointed in the same direction. Another mixer circuit is called a star circuit, which uses two diodes pointing toward the central node and two diodes pointing away from the central node.

Double balanced and double-double balanced mixers have been described in the prior art. Diode-type double-balanced mixers belong to the general classification of "Resistive Switching" mixers. Referring to FIG. 1, a prior art four diode mixer 100 is shown. In this type of mixer, a local oscillator input signal is applied to input port LO that is sufficiently large to cause strong conduction of the alternate diode pairs D101 and D102 or D103 and D104, thereby changing them from a low to a high resistance state during each half of the LO cycle. A virtual ground is, therefore, switched or commutated between the radio frequency/intermediate frequency (RF/IF) transformer T102 windings at a rate corresponding to the LO frequency. Since this switching causes a 180 degree phase reversal of the RF to IF port transmission during each half of the LO cycle, the mixing process is called bi-phase modulation. For low frequency operation, these devices typically use ferrite core flux coupled transformers which exhibit leakage inductance and stray capacitance which limits their upper frequency operation and have poor isolation. Using the mixer of FIG. 1, overlapping RF-IF or LO-IF frequency coverage is very difficult to attain because the IF output encounters both the RF and LO structures in series for the IF signal path.

Turning now to FIG. 2, another prior art mixer is shown. A more complex eight diode mixer 200 is shown that produces an overlapping IF range. Mixer 200 has two diode rings DR202 and DR204 that are coupled together. Examination of this mixer structure reveals that the LO is switching two diode pairs at a time which are in series with the RF-IF signal path. By tracing out the RF to IF signal connections for each half of the LO input cycle, we see that bi-phase modulation is again being performed. The IF port can be seen to be an RF and LO null. The principle advantage of this design is its large RF-IF range overlap, but with twice as many diodes it requires more LO drive.

These basic mixer types can be further sub-divided into categories by the nature of their mixing elements as follows:

- Class I. The most common design consists of a pair (or more) of the ferrite-core wideband transformers with four diodes connected in a "ring" configuration. Nominally, these components require about +7 dBm LO drive power.
- Class II, Type 1. This type also uses the ring topology with two series-connected diodes in each are. The eight diodes may be similar or different. LO drive levels typically range from +13 to +17 dBm.
- Class II, Type 2. These rely on a ring connection, but feature a precision resistor in series with a single diode in each arm. These four-diode designs are typically driven at +17 dBm.
- Class III. These are essentially Class II, Type 2 circuits with a large capacitor connected in parallel with the precision series resistor, and they are driven by LO signal in the +20 to +30 dBm range.
- Class IV. Termination Insensitive Mixers. This mixer circuit, called TIM, consists of a transmission line hybrid network driving two sets of diodes. Isolation between each hybrid's opposite ports allows the LO to independently control the switching action of alternately conducting diode sets.

Referring now to FIG. 3, another prior art double-double balanced mixer 300 is shown. Mixer 300 has a LO balun B1 connected to a pair of ring diodes DR1 and DR2. The LO balun has an input port LO and a pair transformers T1 and T2. An RF input port RF is coupled to an RF balun B2. RF balun B2 has a pair of transformers T3 and T4. Ring diode DR1 has diodes D1, D2, D3 and D4. Ring diode DR2 has diodes D5, D6, D7 and D8. The IF output port IF is coupled to the junction of diodes D1, D4 and D5, D8. The mixer of FIG. 3, is better suited to low frequency operation and does not have high LO to RF or LO to IF isolation over a wide frequency range.

While double balanced mixers have been used, they have suffered from not being able to provide high isolation over a wide frequency range. A current unmet need exists for an improved double balanced mixer that has high isolation over a wide frequency range.

SUMMARY OF THE INVENTION

It is a feature of the invention to provide a double balanced mixer for mixing an RF input signal with a local oscillator signal to provide at an output an intermediate frequency signal with high isolation over a wide frequency range.

Another feature of the invention is to provide a double balanced mixer that includes a local oscillator balun that is operable to receive a local oscillator signal. A RF balun that is operable to receive a RF signal. A first mixer has a first input port that is coupled to the local oscillator balun. A second input port is coupled to the RF balun and an output port provides an intermediate frequency signal. A second mixer is coupled in parallel with the first mixer. The second mixer has a first input port that is coupled to the local oscillator balun. A second input port that is coupled to the RF balun and an output port that provides an intermediate frequency signal. An intermediate frequency balun is coupled to the output ports of the first and second mixers.

Another feature of the invention is to provide a double-double balanced mixer having improved operational characteristics over the prior art.

A further object of the invention is to provide a double-double balanced mixer which uses three pairs of balun transformers along with a pair of diode rings to extend the operating frequency range of the mixer.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

In order that the invention may be more fully understood, it will now be described, by way of example, with reference to the accompanying drawings in which.

It is noted that the drawings of the invention are not to scale. In the drawings, like numbering represents like elements between the drawings.

DETAILED DESCRIPTION OF THE PREFERRED EMBODIMENT(S)

Figure 2:
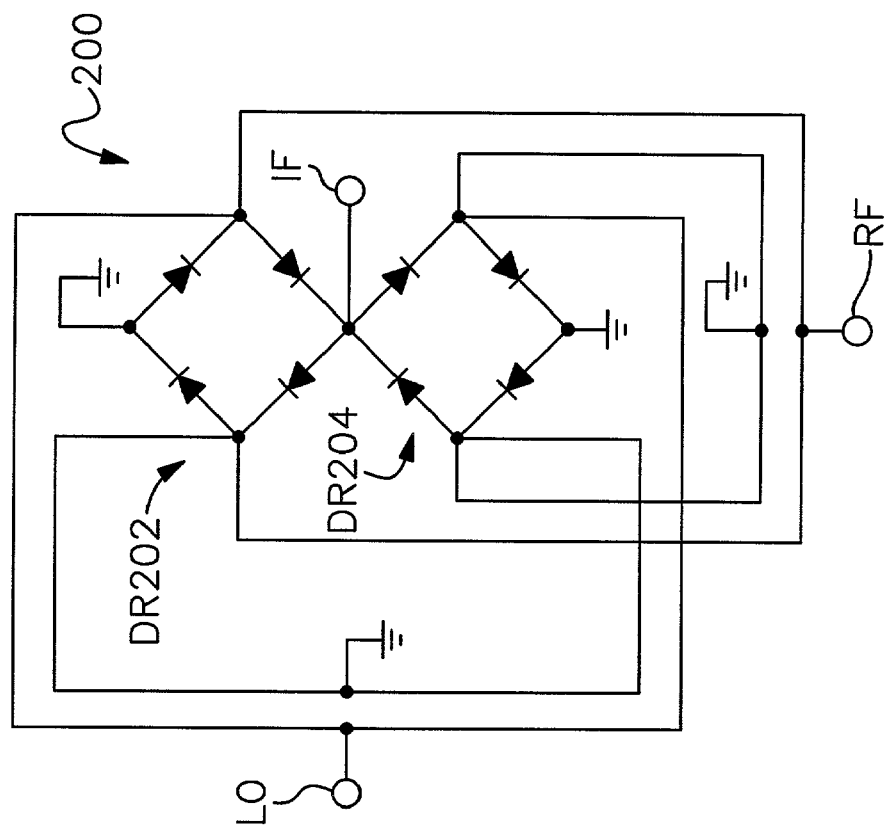
FIG. 2 is a schematic drawing of another prior art mixer.
Figure 1:
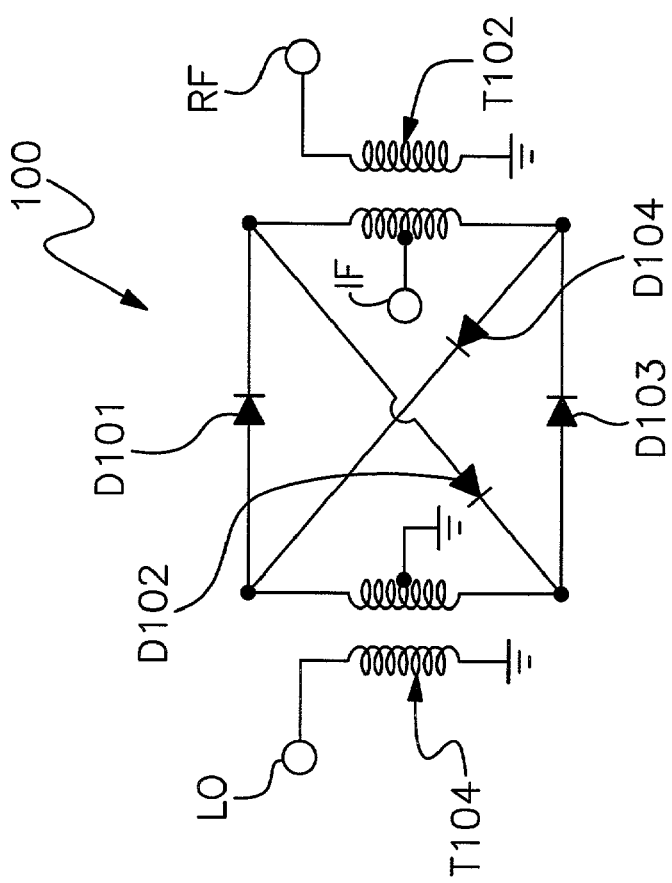
FIG. 1 is a schematic drawing of a prior art mixer.
Figure 3:
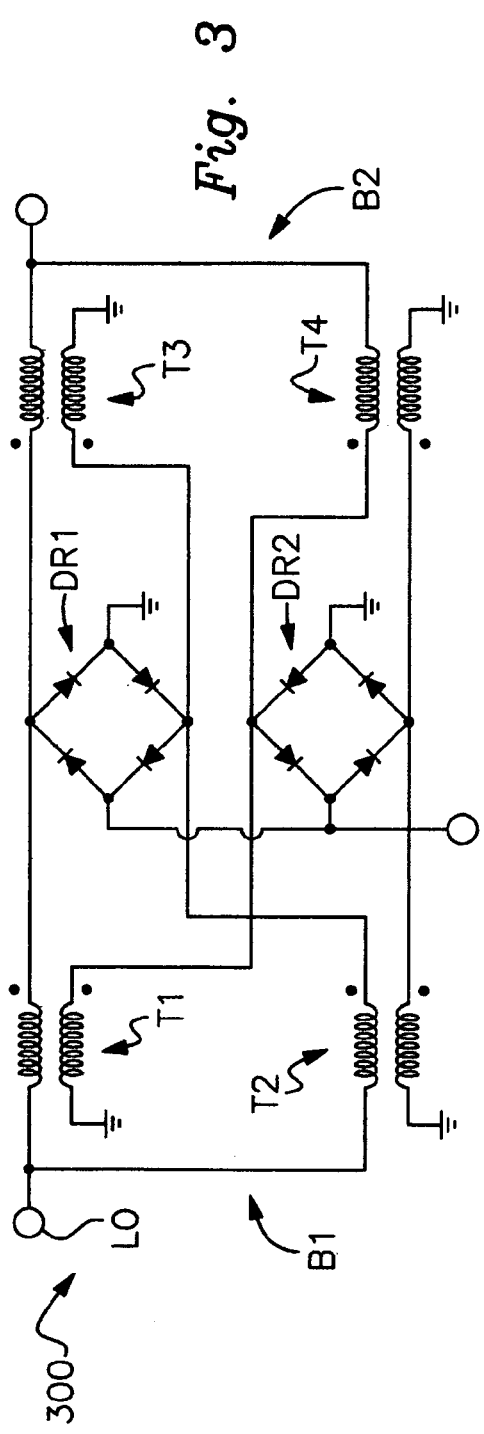
FIG. 3 is a schematic drawing of yet another prior art mixer.
Figure 4:
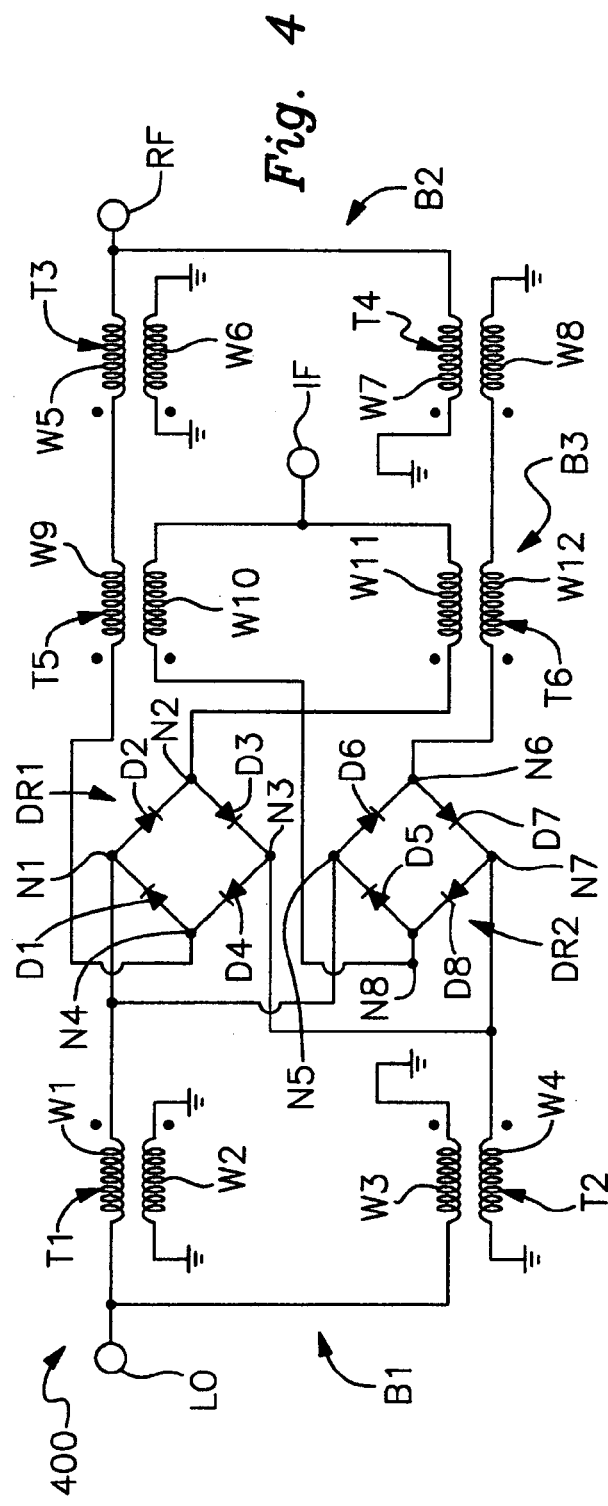
FIG. 4 is a schematic drawing of the preferred embodiment of the present invention.

FIG. 4 shows a schematic drawing of the preferred embodiment of the present invention. Double-double balanced mixer 400 has a local oscillator input terminal LO for receiving a local oscillator signal, an RF input terminal RF for receiving an RF signal and an intermediate frequency output terminal IF for providing an intermediate frequency output signal.

A first mixer or diode ring DR1 has diodes D1, D2, D3 and D4. Each diode has an anode and a cathode. The cathode of diode D1 is connected to the anode of diode D2 at a port or node N1. The cathode of diode D2 is connected to the anode of diode D3 at a port or node N2. The cathode of diode D3 is connected to the anode of diode D4 at a port or node N3. The cathode of diode D4 is connected to the anode of diode D1 at a port or node N4.

A second mixer or diode ring DR2 has diodes D5, D6, D7 and D8. Each diode has an anode and a cathode. The cathode of diode D5 is connected to the anode of diode D6 at a node N5. The cathode of diode D6 is connected to the anode of diode D7 at a node N6. The cathode of diode D7 is connected to the anode of diode D8 at a node N7. The cathode of diode D8 is connected to the anode of diode D5 at a node N8. Mixers DR1 and DR2 are effectively coupled in parallel.

Local oscillator port LO is connected to local oscillator balun B1. Balun B1 has a pair of transformers T1 and T2. Transformer T1 has wire windings W1 and W2. Transformer T2 has wire windings W3 and W4. Windings W1–W4 are wound on a figure eight shaped core (not shown) that are commonly used with baluns. Winding W1 has one end connected to port LO and the other end connected to nodes N1 and N5. Winding W2 has both ends connected to ground. Winding W3 has one end connected to ground and the other end connected to port LO. Winding W4 has one end connected to node N3 and N7 and the other end connected to ground. The dots on the windings identify its polarity with respect to another winding. Thus the local oscillator signal is connected to the mixers through baluns B1.

Intermediate frequency output port IF is connected to IF balun B3. Balun B3 has a pair of transformers T5 and T6. Balun B3 has wire windings W9, W10, W11 and W12. Windings W9–W12 are wound on a figure eight shaped core (not shown) that are commonly used with baluns. Winding W9 has one end connected to node N4. Winding W10 has one end connected to the IF port IF and the other end connected to node N8. Winding W11 has one end connected to IF port IF and the other end connected to node N2. Winding W12 has one end connected to node N6. Thus the Intermediate frequency signal IF is provided to output port IF through balun B3.

RF input port RF is connected to RF balun B2. Balun B2 has a pair of transformers T3 and T4. Balun B2 has wire windings W5, W6, W7 and W8. Windings W5–W8 are wound on a figure eight shaped core (not shown) that are commonly used with baluns. Winding W5 has one end connected to port RF and the other end connected to winding W9. Winding W6 has both ends connected to ground. Winding W7 has one end connected to ground and the other end connected to port RF. Winding W8 has one end connected to winding W12 and the other end connected to ground. Thus, the RF signal is connected to the mixers through balun B2.

The following examples 1 and 2 are provided to further teach and explain the present invention.

EXAMPLE 1

Figure 5:
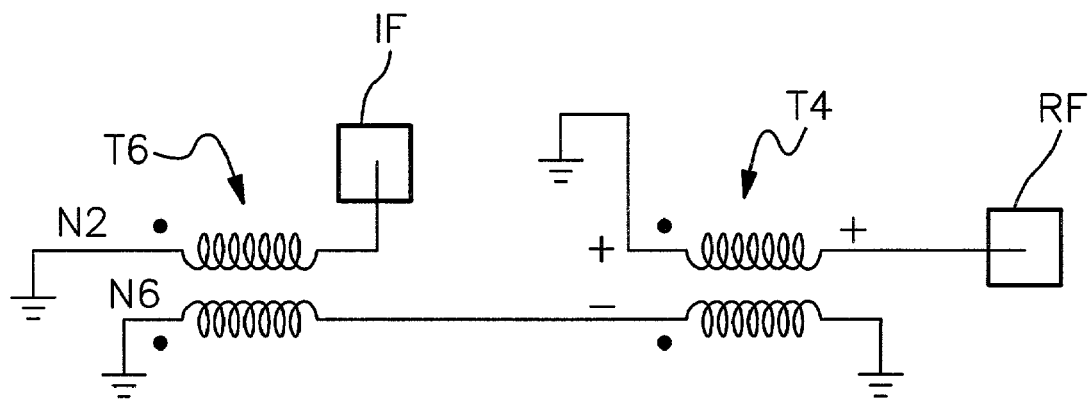
FIG. 5 is a schematic drawing illustrating the operation of the present invention.

Referring to FIGS. 4 and 5, the operation of the circuit of FIG. 4 when the local oscillator signal is positive relative to ground is shown. Assume that all of the diodes are symmetrical. During the positive half of the LO signal, diodes, D2, D3, D6 and D7 conduct while diodes D1, D4, D5 and D8 are at cutoff. In this case, nodes N2 and N6 are virtually grounded while nodes N4 and N8 are disconnected. The equivalent circuit is shown in FIG. 5. The negative –RF signal is transformed to the IF signal. The IF output is equal to the negative –RF signal.

EXAMPLE 2

Figure 6:
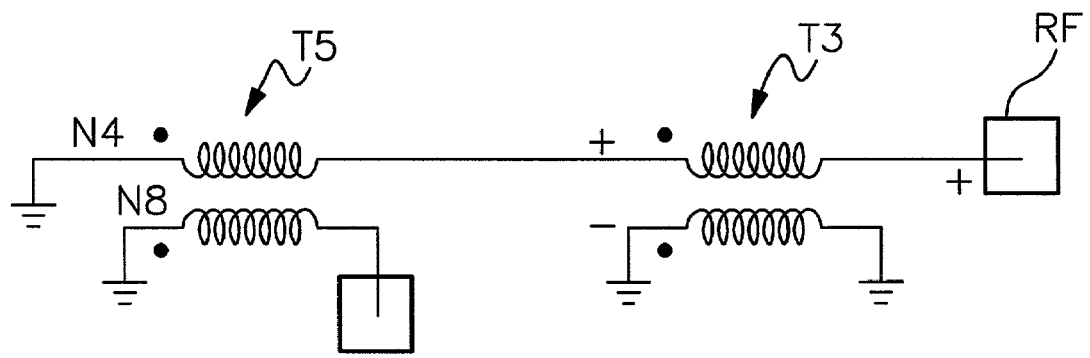
FIG. 6 is a schematic drawing illustrating the operation of the present invention.

Referring to FIGS. 4 and 6, the operation of the circuit of FIG. 4 when the local oscillator signal is negative relative to ground is shown. Assume that all of the diodes are symmetrical. During the negative half of the LO signal, diodes, D1, D4, D5 and D8 conduct while diodes D2, D3, D6 and D7 are at cutoff. In this case, nodes N4 and N8 are virtually grounded while nodes N2 and N6 are disconnected. The equivalent circuit is shown in FIG. 6. The positive +RF signal is transformed to the IF signal. The IF output is equal to the positive +RF signal.

Figure 7:
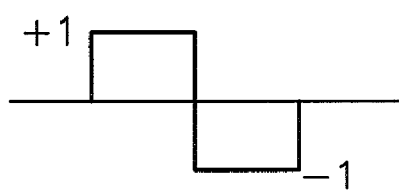
FIG. 7 is a graph showing how the IF output signal responds to the LO signal.

Referring to FIG. 7, a graph showing how the IF output signal responds to the LO signal is shown. When the LO signal is positive, the IF signal is equal to the negative RF signal. When the LO signal is negative, the IF signal is equal to the positive RF signal.

The present invention has several advantages. Since, nodes N4 and N8 or N2 and N6 are virtually grounded during operation, only remnants or leakage signals due to parasitic elements of the local oscillator signal LO arrive to these nodes. The leakage local oscillator LO signals arriving at these nodes have the same amplitude and phase. When these signals arrive at nodes N4 and N8 or N2 and N6, they are therefore cancelled at the RF and IF ports because of the baluns B2 and B3. The present invention provides "double isolation" of the local oscillator signal LO from the RF and IF ports. The configuration of these baluns is self compensating. The mixer of FIG. 4 provides a high LO to RF and LO to IF isolation over a wide frequency range.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A double balanced mixer for mixing an RF input signal with a local oscillator signal to provide at an output an intermediate frequency signal, comprising:

a first diode ring having a first, second, third and fourth nodes;

a second diode ring having a fifth, sixth, seventh and eighth nodes;

a local oscillator balun for receiving a local oscillator signal at a local oscillator port, the local oscillator balun having first, second, third and fourth windings, the first winding having one end connected to the local oscillator port and the other end connected to the first node, the second winding having both ends connected to ground, the third winding having one end connected to the local oscillator port and the other end connected to ground, the fourth winding having one end connected to ground and the other end connected to the third node and the seventh node;

a radio frequency balun for receiving an RF signal at an RF port, the radio frequency balun having fifth, sixth, seventh and eighth windings, the fifth winding having one end connected to the RF port, the sixth winding having both ends connected to ground, the seventh winding having one end connected to the RF port and another end connected to ground, the eight winding having one end connected to ground; and an intermediate frequency balun for providing an intermediate frequency signal at an intermediate frequency port, the intermediate frequency balun having ninth, tenth, eleventh and twelfth windings, the ninth winding having one end connected to the fifth winding and another end connected to the fourth node, the tenth winding having one end connected to the eighth node and another end connected to the intermediate frequency port, the eleventh winding having one end connected to the second node and another end connected to the intermediate frequency port, the twelfth winding having one end connected to the sixth node and another end connected to the eighth winding.

2. The double balanced mixer according to claim 1, wherein each diode ring comprises:

a first diode having an anode and a cathode;

a second diode having an anode and a cathode, the cathode of the first diode connected to the anode of the second diode;

a third diode having an anode and a cathode, the cathode of the second diode connected to the anode of the third diode; and a fourth diode having an anode and a cathode, the cathode of the third diode connected to the anode of the fourth diode and the cathode of the fourth diode connected to the anode of the first diode.

3. The double balanced mixer according to claim 1, wherein parasitic elements of the local oscillator signal are cancelled in the intermediate frequency and radio frequency baluns.

4. The double balanced mixer according to claim 1, wherein isolation between the local oscillator signal and the RF and intermediate frequency signals is increased.

5. A double balanced mixer, comprising:

a first mixer having first, second, third and fourth nodes;

a second mixer having fifth, sixth, seventh and eighth nodes, the second mixer coupled in parallel with the first mixer, the first node being connected with the fifth node, the third node connected to the seventh node;

a local oscillator balun operable to receive a local oscillator signal, the local oscillator balun having a local oscillator port, a first transformer and a second transformer, the first transformer connected to the first node, the second transformer connected to the seventh node, the first and second transformers further connected to the local oscillator port;

a RF balun operable to receive a RF signal, the RF balun having an RF port, a third transformer and a fourth transformer, the third and fourth transformers connected to the RF port; and an intermediate frequency balun operable to provide an intermediate frequency signal, the intermediate frequency balun having an intermediate frequency port, a fifth and a sixth transformer, the fifth transformer connected with the third transformer, the sixth transformer connected with the fourth transformer, the fifth transformer further connected to the fourth and eighth nodes, the sixth transformer further connected to the second and sixth nodes, the fifth and sixth transformers further connected to the intermediate frequency port.

6. The double balanced mixer according to claim 5, wherein the first and second mixers are each ring diodes.

7. The double balanced mixer according to claim 6, wherein the ring diodes each comprise four diodes.

8. The double balanced mixer according to claim 6, wherein each diode ring comprises:

a first diode having an anode and a cathode;

a second diode having an anode and a cathode, the cathode of the first diode connected to the anode of the second diode;

a third diode having an anode and a cathode, the cathode of the second diode connected to the anode of the third diode; and a fourth diode having an anode and a cathode, the cathode of the third diode connected to the anode of the fourth diode and the cathode of the fourth diode connected to the anode of the first diode.

9. The double balanced mixer according to claim 5, wherein the first transformer has a first and second winding and the second transformer has a third and fourth winding.

10. The double balanced mixer according to claim 5, wherein the third transformer has a fifth and sixth winding and the fourth transformer has a seventh and eighth winding.

11. The double balanced mixer according to claim 5, wherein the fifth transformer has a ninth and tenth winding and the sixth transformer has an eleventh and twelfth winding.

* * * * *